(12) United States Patent
Chu

(10) Patent No.: US 8,934,307 B2
(45) Date of Patent: Jan. 13, 2015

(54) VOLTAGE GENERATOR OF NONVOLATILE MEMORY DEVICE

(75) Inventor: Gyo Soo Chu, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 223 days.

(21) Appl. No.: 13/605,947

(22) Filed: Sep. 6, 2012

(65) Prior Publication Data

US 2013/0107642 A1 May 2, 2013

(30) Foreign Application Priority Data

Oct. 27, 2011 (KR) .................. 10-2011-0110595

(51) Int. Cl.
G11C 5/14 (2006.01)

(52) U.S. Cl.
CPC ........................... *G11C 5/145* (2013.01)
USPC .............. 365/189.09; 365/185.2; 365/185.22; 365/185.23

(58) Field of Classification Search
USPC ................ 365/189.09, 185.22, 185.2, 185.23
See application file for complete search history.

(56) References Cited

U.S. PATENT DOCUMENTS

| | | | |
|---|---|---|---|
| 6,642,774 B1 * | 11/2003 | Li | 327/536 |
| 6,990,031 B2 * | 1/2006 | Hashimoto et al. | 365/222 |
| 7,110,292 B2 * | 9/2006 | Hahn et al. | 365/185.03 |
| 7,272,047 B2 * | 9/2007 | Chae et al. | 365/185.19 |
| 7,564,300 B2 * | 7/2009 | Lee | 327/540 |
| 7,936,154 B2 * | 5/2011 | Lee | 323/266 |
| 8,471,537 B2 * | 6/2013 | Joo | 323/267 |

* cited by examiner

*Primary Examiner* — Pho M Luu
(74) *Attorney, Agent, or Firm* — IP & T Group LLP

(57) ABSTRACT

A voltage generator of a nonvolatile memory device includes a pump circuit for generating a pump output voltage by performing a pumping operation and raise or maintain the output voltage in response to a double enable signal or a single enable signal, a first regulator for comparing a first division voltage with a first reference voltage and generating the double enable signal according to a result of the comparison, a second regulator for comparing a second division voltage with a second reference voltage and outputting the voltage of the first level as a first regulation voltage, and a third regulator for comparing the second division voltage with the second reference voltage and generating the single enable signal according to a result of the comparison.

22 Claims, 3 Drawing Sheets

VOLTAGE GENERATOR OF NONVOLATILE MEMORY DEVICE

CROSS-REFERENCE TO RELATED APPLICATION

Priority to Korean patent application number 10-2011-0110595 filed on Oct. 27, 2011, the entire disclosure of which is incorporated by reference herein, is claimed.

BACKGROUND

An embodiment of this disclosure relates to the voltage generator of a nonvolatile memory device and, more particularly, to the voltage generator of a nonvolatile memory device which is capable of reducing an area.

Recently, there is an increasing demand for a nonvolatile memory device which enables electrical program and erasure and does not perform a refresh operation of rewriting data every specific interval to prevent loss of data.

In the nonvolatile memory device, a program voltage, an erase voltage, and a read voltage are supplied to word lines in order to store specific data in a memory cell array. These voltages are generally supplied by a voltage generator.

A known voltage generator includes a regulator configured to output a pumping voltage by operating a charge pump according to a specific clock cycle and stabilizing the pumping voltage in a constant level. In this construction, when the pumping voltage becomes a constant level or higher, the operation of the charge pump is stopped.

FIG. 1 is a circuit diagram showing a voltage generator having a double regulator structure.

Referring to FIG. 1, the voltage generator 10 includes an oscillator 11, a pump 12, and first to third regulators 13 to 15.

The oscillator 11 generates a clock CLK having a constant cycle. The pump 12 generates a pump output voltage PUMPOUT in response to the clock CLK. The first regulator 13 compares a voltage Va, divided from the pump output voltage PUMPOUT, with a first reference voltage $V_{BG}$ to output a first comparison signal CS1 according to a result of the comparison. The first comparison signal CS1 controls the output operation of the oscillator 11. That is, when the pump output voltage PUMPOUT becomes a set level or higher, the first regulator 13 stops the output operation of the oscillator 11. Accordingly, the pump output voltage PUMPOUT generated from the pump 12 may not increase. The second and the third regulators 14 and 15 generate first and second regulation voltages VREG1 and VREG2 having different levels, respectively, by dividing the pump output voltage PUMPOUT.

The above-described voltage generator having a double regulator structure has an excellent power supply rejection ratio (PSRR), because the first regulator 13 maintains the pump output voltage PUMPOUT regularly. The voltage generator with a double regulator structure less affects a distribution of the threshold voltages of the memory cells of a nonvolatile memory device, because the first and the second regulation voltages VREG1 and VREG2 generated from the second and the third regulators 14 and 15 have a small ripple.

In the above-described voltage generator having a double regulator structure, the plurality of regulators consumes an amount of current because current paths Current1 to Current5 due to a number of the regulators increase. Furthermore, if the type of voltages used in a nonvolatile memory device increases, the number of regulators also increases, thereby further increasing current paths.

In order to solve the concerns, a nonvolatile memory device includes not only the above-described voltage generator having a double regulator structure but a voltage generator including a single regulator structure for a high level voltage.

FIG. 2 is a circuit diagram showing a voltage generator having a single regulator structure.

Referring to FIG. 2, the voltage generator 20 having a single regulator structure includes a first voltage generator 21 for generating a first regulation voltage VREG1 and a second voltage generator 22 for generating a second regulation voltage VREG2.

The first voltage generator 21 stabilizes voltage generated from a pump 21B, using a regulator 21C, and generates the first regulation voltage VREG1 having the stabilized voltage. The second voltage generator 22 has a similar structure and operation to the first voltage generator 21.

The voltage generator 20 having a single regulator structure has low current consumption, because it the number of current paths is smaller than that of the voltage generator 10 having a double regulator structure. However, the voltage generator 20 with a single regulator structure has an adverse effect on the PSRR, because the source power of the pump has a great ripple always. Accordingly, a ripple is generated in the outputted first and the second regulation voltages VREG1 and VREG2. As a result, a distribution of the threshold voltages of memory cells is widened by operating voltages used in a nonvolatile memory device. Furthermore, a time gap between the time for rising a level of the first regulation voltage VREG1 in the first voltage generator 21 and the time for outputting a level of the second regulation voltage VREG2 in the second voltage generator 22 is generated based on different loads, because the first and the second voltage generators 21 and 22 have different power sources. Accordingly, the time taken for the first regulation voltage VREG1 to be generated may differ from the time tame taken for the second regulation voltage VREG2 to be generated.

The known nonvolatile memory device includes both the voltage generator having a double regulator structure and the voltage generator having a single regulator structure. If device characteristics are deteriorated because a distribution of the threshold voltages of memory cells is widened by the voltage generator having a single regulator structure, the voltage generator having a double regulator structure is used instead of the voltage generator having a single regulator structure. As a result, there are concerns about an integration degree because voltage generators occupy a very large area in a nonvolatile memory device. Current consumption is large although the voltage generator having the double regulator structure is used.

BRIEF SUMMARY

An exemplary embodiment of this disclosure relates to the voltage generator of a nonvolatile memory device which is capable of reducing an area occupied by voltage generators and effectively removing the ripple of an output voltage.

In an aspect of this disclosure, a voltage generator of a nonvolatile memory device includes an oscillator configured to generate clocks; a pump circuit configured to generate a pump output voltage in response to the clocks; a first regulator configured to compare a first division voltage, divided from the pump output voltage, with a first reference voltage in response to a pass regulator enable signal and generate a double enable signal for controlling the oscillator according to a result of the comparison; a second regulator comprising a comparator for comparing a second division voltage with a second reference voltage in response to a double regulator signal and generating a control signal according to a result of the comparison, a control circuit for supplying the pump output voltage to an output terminal in response to the control signal, and a voltage divider for generating the second division voltage by dividing voltage of the output terminal; and a third regulator configured to compare the second division voltage and a third reference voltage in response to a single regulator signal and generate a single enable signal for controlling the oscillator according to a result of the comparison.

In another aspect of this disclosure, a voltage generator of a nonvolatile memory device includes a pump circuit configured to generate a pump output voltage by performing a pumping operation and raise or maintain the output voltage in response to a double enable signal or a single enable signal; a first regulator configured to compare a first division voltage, divided from the pump output voltage, with a first reference voltage to generate the double enable signal according to a result of the comparison; a first regulator configured to compare a first division voltage, divided from the pump output voltage, with a first reference voltage to generate the double enable signal according to a result of the comparison; a second regulator configured to compare a second division voltage, divided from the pump output voltage, with a second reference voltage, convert the pump output voltage into voltage of a first level according to a result of the comparison, and output the voltage of the first level as a first regulation voltage; and a third regulator configured to compare the second division voltage with the second reference voltage and generate the single enable signal according to a result of the comparison.

In another aspect of this disclosure, a voltage generator of a nonvolatile memory device includes a pump circuit configured to generate a pump output voltage; a first regulator configured to compare a first division voltage, divided from the pump output voltage, with a first reference voltage and generate a double enable signal according to a result of the comparison; a second regulator configured to convert the pump output voltage into voltage of a constant level and output the voltage of the constant level as a regulation voltage; a third regulator configured to compare a second division voltage, divided from the pump output voltage, with a second reference voltage and generate a single enable signal according to a result of the comparison; and a control signal generator configured to generate an enable signal for controlling the pump circuit in response to the double enable signal and the single enable signal.

In another aspect of this disclosure, a voltage generator of a nonvolatile memory device includes a pump circuit configured to generate a pump output voltage by performing a pumping operation and raise or maintain the output voltage in response to a double enable signal or a single enable signal; a first regulator configured to compare a first division voltage, divided from the pump output voltage, with a first reference voltage when a double regulation operation is performed and generate the double enable signal according to a result of the comparison; a second regulator configured to convert the pump output voltage into voltage of a first level and generate the voltage of the first level as a first regulation voltage; and a third regulator configured to compare a second division voltage, divided from the pump output voltage, with a second reference voltage when a single regulation operation is performed, generate the single enable signal according to a result of the comparison, and coupling a capacitor between the pump output voltage and a ground when the double regulation operation is performed so that the pump output voltage is stabilized.

DESCRIPTION OF EMBODIMENT

Hereinafter, an exemplary embodiment of the present disclosure will be described in detail with reference to the accompanying drawings. The figures are provided to allow those having ordinary skill in the art to understand the scope of the embodiment of the disclosure.

Figure 1:
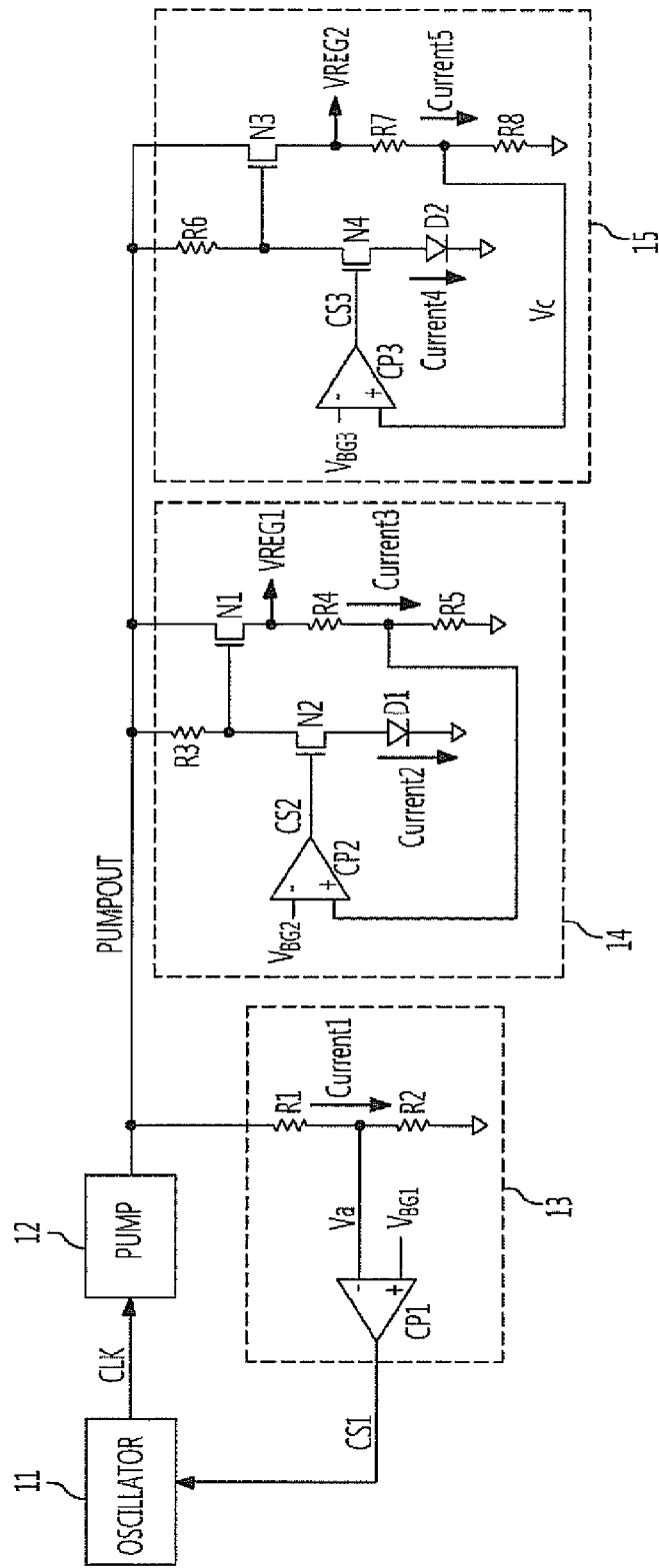
FIG. 1 is a circuit diagram showing a voltage generator having a double regulator structure.
Figure 2:
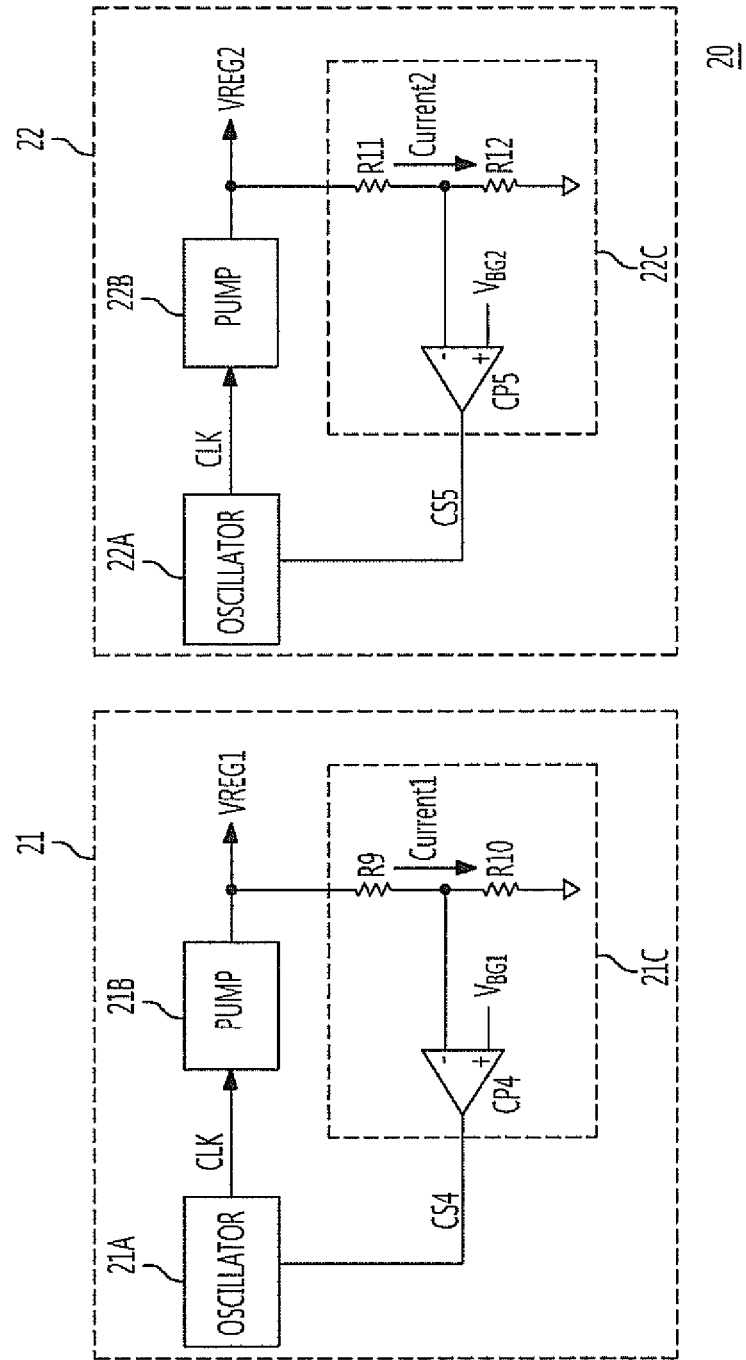
FIG. 2 is a circuit diagram showing a voltage generator having a single regulator structure.
Figure 3:
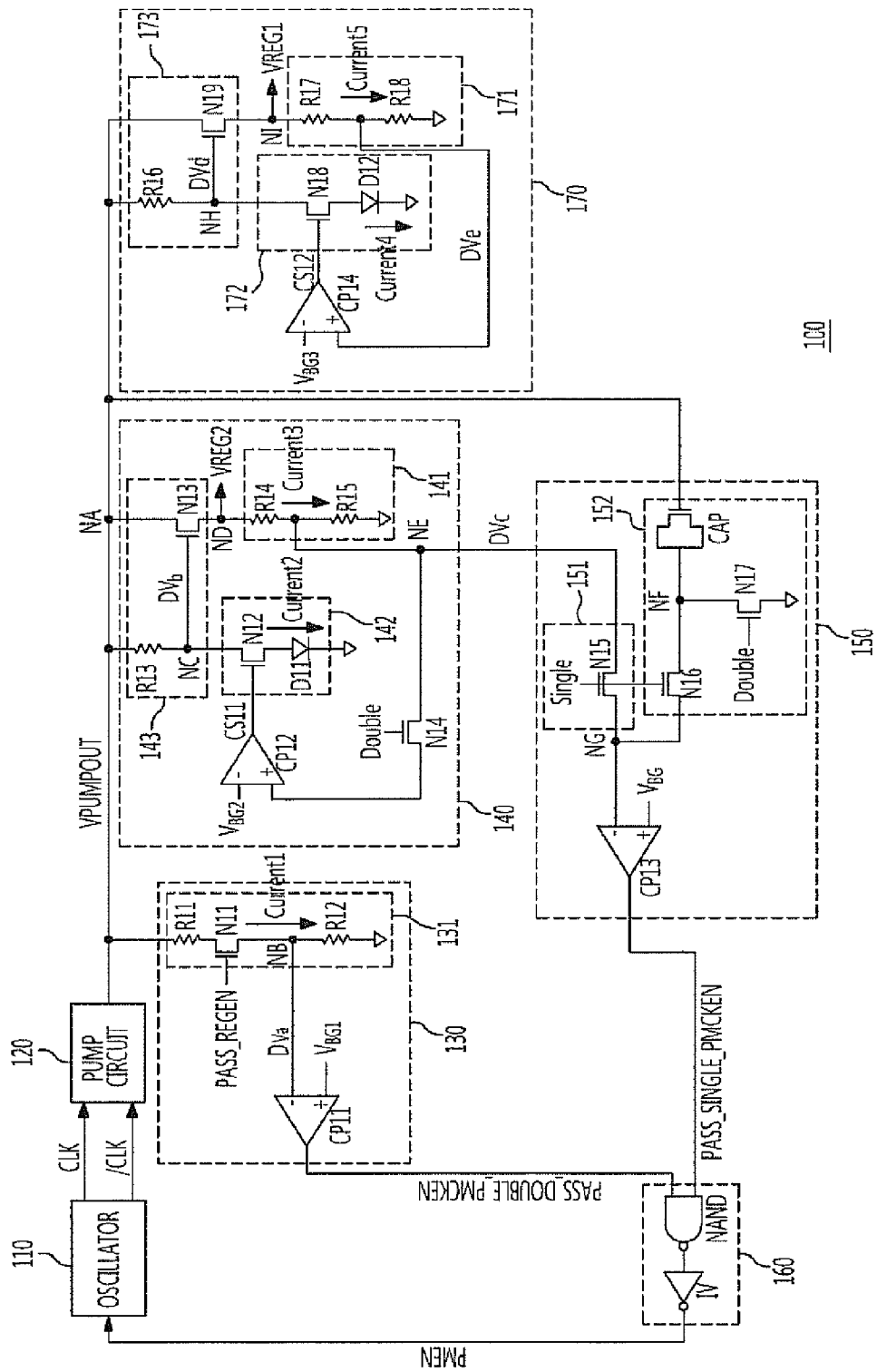
FIG. 3 is a circuit diagram showing a voltage generator in accordance with an exemplary embodiment of this disclosure.

FIG. 3 is a circuit diagram showing a voltage generator in accordance with an exemplary embodiment of this disclosure.

Referring to FIG. 3, the voltage generator 100 includes an oscillator 110, a pump circuit 120, a first regulator 130, a second regulator 140, a third regulator 150, a control signal generator 160, and a fourth regulator 170.

The oscillator 110 generates a clock CLK having a constant cycle and an inverted clock/CLK having a phase inverted from the clock CLK in response to an enable signal PMEN.

The pump circuit 120 includes a plurality of pump units, and generates a pump output voltage VPUMPOUT by executing a pumping operation in response to the clock CLK and the inverted clock/CLK.

The first regulator 130 compares a division voltage $D_{VA}$, divided from the pump output voltage VPUMPOUT, with a first reference voltage $V_{BG1}$ to generate a double enable signal PASS_DOUBLE_PMCKEN according to a result of the comparison.

The first regulator 130 includes a division voltage generator 131 and a comparator CP11.

The division voltage generator 131 includes resistors R11 and R12 and an NMOS transistor N11. The resistor R11, the NMOS transistor N11, and the resistor R12 are coupled in series between the output node NA of the pump circuit 120 and a ground. The NMOS transistor N11 is turned on in response to a pass regulator enable signal PASS_REGEN. The pass regulator enable signal PASS_REGEN is activated in a high level when a double regulator operation is performed.

The comparator CPU compares the division voltage $D_{VA}$ at a node NB between the NMOS transistor N11 and the resistor R12 with the first reference voltage $V_{BG1}$. The comparator CP11 outputs the double enable signal PASS_DOUBLE_PMCKEN according to a result of the comparison.

The first regulator 130 is activated in response to the pass regulator enable signal PASS_REGEN. The first regulator 130 compares the division voltage $D_{VA}$, divided from the pump output voltage VPUMPOUT, with the first reference voltage $V_{BG1}$ in response to the divided resistance value of the resistor R11 and the resistor R12. The first regulator 130 outputs the double enable signal PASS_DOUBLE_PMCKEN according to a result of the comparison.

The second regulator 140 converts the pump output voltage VPUMPOUT into voltage of a constant level to output a second regulation voltage VREG2 having a constant level.

The second regulator 140 includes a comparator CP12, a voltage divider 141, a current cut-off unit 142, and a current supply circuit 143.

The voltage divider 141 includes a plurality of resistors (for example, R14 and R15) coupled in series. The voltage divider 141 outputs a division voltage DVc by dividing the second regulation voltage VREG2 according to a ratio of the resistance values of the resistors R14 and R15. To this end, the plurality of resistors R14 and R15 is coupled in series between an output terminal ND and the ground. The division voltage DVc according to a ratio of the resistance values of the resistors R14 and R15 is inputted to the comparator CP12. At this time, the voltage divider 141 controls the second regulation voltage VREG2 by adjusting the resistance value of the resistor R14.

The comparator CP12 compares the division voltage DVc with a second reference voltage $V_{BG2}$ to output a comparison signal CS11 according to a result of the comparison. The comparator CP12 may include an OP amp. Here, the second reference voltage $V_{BG2}$ is inputted to the negative terminal (−) of the OP amp. The division voltage DVc is inputted to the positive terminal (+) of the OP amp. The second regulator 140 may further include an NMOS transistor N14 coupled between a node NE, which is between the resistors R14 and R15 of the voltage divider 141, and the positive terminal (+) of the OP amp. The NMOS transistor N14 is turned on in response to a double regulator signal Double.

The NMOS transistor N14 is turned on in response to the double regulator signal Double that is activated when a double regulation operation is performed. The comparator CP12 outputs the comparison signal CS11 of a high level, when the division voltage DVc is higher than the second reference voltage $V_{BG2}$. Herein, a high or low level of signal is in a scope to be recognized as a digital logic value '0' or '1'. Otherwise, the comparator CP12 outputs the comparison signal CS11 of a low level, when the division voltage DVc is lower than the second reference voltage $V_{BG2}$.

The current cut-off unit 142 forms a current path Current2 ranging from the output node NA to the ground. To this end, the current cut-off unit 142 includes an NMOS transistor N12 turned on in response to the comparison signal CS11 generated from the comparator CP12. The NMOS transistor N12 is coupled between the current supply circuit 143 and the ground. The NMOS transistor N112 is turned on in response to the comparison signal CS11 of a high level, thus forming the current path Current2 that ranges from the output node NA to the ground. The current cut-off unit 142 may further include a diode D11 coupled between the NMOS transistor N12 and the ground. The diode D11 is configured to prevent a reverse current.

In this construction, when the division voltage DVc is higher than the second reference voltage $V_{BG2}$, the current cut-off unit 142 forms the current path Current2 in response to the comparison signal CS11 of a high level that is generated from the comparator CP12. Otherwise, when the division voltage DVc is lower than the second reference voltage $V_{BG2}$, the current cut-off unit 142 cuts off the current path Current2 in response to the comparison signal CS11 of a low level.

The current supply circuit 143 couples or cuts off the output node NA and the output terminal ND of the second regulator 140, according to the amount of current that flows through the current path Current2.

The current supply circuit 143 includes a resistor R13, coupled between the output node NA and the current cut-off unit 142, and an NMOS transistor N13 coupled between the output node NA and the output terminal ND of the second regulator 140. Here, voltage at a node NC between the resistor R13 and the current cut-off unit 142 is supplied to the gate of the NMOS transistor N13.

When the amount of current flowing through the current path Current2 suddenly increases because the pump output voltage VPUMPOUT of the output node NA suddenly shifts, the current supply circuit 143 forms an additional current path Current3. Accordingly, the current cut-off unit 142 may be protected.

When the amount of current flowing through the current path Current2 excessively increases, voltage $DV_b$ across the resistor R13 increases. When the voltage $DV_b$ becomes higher than the threshold voltage of the NMOS transistor N13 of the current supply circuit 143, the NMOS transistor N13 is turned on, so that the current path Current3 is formed.

The third regulator 150 is activated when a single regulation operation is performed. The third regulator 150 compares the division voltage DVc, generated from the voltage divider 141 of the second regulator 140, with a reference voltage $V_{BG}$. The third regulator 150 outputs a single enable signal PASS_SINGLE_PMCKEN according to a result of the comparison.

The third regulator 150 includes a comparator CP13, a first transfer unit 151, and a second transfer unit 152.

The first transfer unit 151 is coupled between the node NE of the voltage divider 141 and the negative terminal (−) of the comparator CP13. The first transfer unit 151 is configured to transfer the division voltage DVc to the negative terminal (−) of the comparator CP13 in response to the single enable signal PASS_SINGLE_PMCKEN. The first transfer unit 151 may be formed of an NMOS transistor N15.

The second transfer unit 152 is coupled between the output node NA and the negative terminal (−) of the comparator CP13. The second transfer unit 152 is configured to transfer the charged voltage of the pump output voltage VPUMPOUT to the negative terminal (−) of the comparator CP13 in response to the single enable signal PASS_SINGLE_PMCKEN. The second transfer unit 152 includes a capacitor CAP and an NMOS transistor N16 which are coupled in series between the output node NA and the negative terminal (−) of the comparator CP13. The second transfer unit 152 further includes an NMOS transistor N17 coupled between the ground and a node NF which is between the capacitor CAP and the NMOS transistor N16. The NMOS transistor N16 is turned on in response to a single regulator signal Single. The NMOS transistor N17 is turned on in response to a double regulator signal Double. When a double regulation operation is performed, the capacitor CAP of the second transfer unit 152 between the output node NA and the ground is turned on, so that the pump output voltage VPUMPOUT is charged, capped, and stabilized.

The control signal generator 160 generates the enable signal PMEN in response to the double enable signal PASS_DOUBLE_PMCKEN, generated from the first regulator 130, and the single enable signal PASS_SINGLE_PMCKEN generated from the third regulator 150.

The control signal generator 160 includes a NAND gate NAND and an inverter IV. The NAND gate NAND logically combines the double enable signal PASS_DOUBLE_PMCKEN and the single enable signal PASS_SINGLE_PMCKEN to output a result of the logical combination. The inverter IV inverts the output signal of the NAND gate NAND to generate the inverted signal as the enable signal PMEN.

The fourth regulator 170 converts the pump output voltage VPUMPOUT into voltage of a constant level to generate a first regulation voltage VREG1.

The fourth regulator 170 includes a comparator CP14, a voltage divider 171, a current cut-off unit 172, and a current supply circuit 173.

The voltage divider 171 includes a plurality of resistors (for example, R17 and R18) coupled in series. The voltage divider 171 generates a division voltage DVe by dividing the first regulation voltage VREG1 according to a ratio of the resistance values of the plurality of resistors. To this end, the plurality of resistors R17 and R18 is coupled in series between an output terminal NI and the ground. The division voltage DVe according to a ratio of the resistance values of the plurality of resistors is inputted to the comparator CP14. At this time, the voltage divider 171 controls the first regulation voltage VREG1 by adjusting the resistance value of the resistor R18.

The comparator CP14 compares the division voltage DVe with a third reference voltage $V_{BG3}$ to output a comparison signal CS12 according to a result of the comparison. The comparator CP14 may be formed of an OP amp. The third reference voltage $V_{BG3}$ is inputted to the negative terminal (−) of the OP amp. The division voltage DVe is inputted to the positive terminal (+) of the OP amp.

The current cut-off unit 172 forms a current path Current4 ranging from the output node NA to the ground. To this end, the current cut-off unit 172 includes an NMOS transistor N18 that is turned in response to the comparison signal CS12 of the comparator CP14. The NMOS transistor N18 is coupled between the current supply circuit 173 and the ground. The NMOS transistor N18 is turned on in response to the comparison signal CS12 of a high level, thus forming a current path Current4 ranging from the output node NA to the ground. The current cut-off unit 172 may further include a diode D12 coupled between the NMOS transistor N18 and the ground. The diode D12 is configured to prevent a reverse current.

In this construction, when the division voltage DVe is higher than the third reference voltage $V_{BG3}$, the current cut-off unit 172 forms the current path Current4 in response to the comparison signal CS12 of a high level. When the division voltage DVe is lower than the third reference voltage $V_{BG3}$, the current cut-off unit 172 cuts off the current path Current4 in response to the comparison signal CS12 of a low level.

The current supply circuit 173 couples or cuts off the output node NA and the output terminal NI of the fourth regulator 170 according to the amount of current that flows through the current path Current4.

The current supply circuit 173 includes a resistor R16, coupled between the output node NA and the current cut-off unit 172, and an NMOS transistor N19 coupled between the output node NA and the output terminal NI of the fourth regulator 170. Here, voltage at a node NH between the resistor R16 and the current cut-off unit 172 is supplied to the gate of the NMOS transistor N19.

When the amount of current flowing through the current path Current4 suddenly increases because the pump output voltage VPUMPOUT of the output node NA suddenly shifts, the current supply circuit 173 forms an additional current path Current5. Accordingly, the current cut-off unit 172 may be protected.

When the amount of current flowing through the current path Current4 excessively increases, voltage DVd across the resistor R16 increases. When the voltage DVd becomes higher than the threshold voltage of the NMOS transistor N19 of the current supply circuit 173, the NMOS transistor N19 is turned in order to form the current path Current5.

The operation of the voltage generator 100 in accordance with an embodiment of this disclosure is divided into a single regulation operation and a double regulator operation and described below.

1) Single Regulation Operation

The oscillator 110 generates the clock CLK having a constant cycle and the inverted clock/CLK. The pump circuit 120 generates the pump output voltage VPUMPOUT in response to the clock CLK and the inverted clock/CLK.

When a single regulation operation is performed, the NMOS transistor N11 of the first regulator 130 is turned off in response to the pass regulator enable signal PASS_REGEN of a low level. Thus, the current path Current1 is not formed. The comparator CP11 generates the double enable signal PASS_DOUBLE_PMCKEN of a high level.

The NMOS transistor N14 of the second regulator 140 is turned off in response to the double regulator signal Double, thus preventing the division voltage DVc divided from the pump output voltage VPUMPOUT from being transferred to the comparator CP12. Thus, the current path Current2 is not formed. The current supply circuit 143 of the second regulator 140 controls the amount of current supplied to the node ND according to the potential of the node NC. The current supply circuit 143 outputs a voltage, divided according to the resistance value of the voltage divider 141, to the second output voltage VREG2.

The third regulator 150 compares the division voltage DVc, generated from the voltage divider 141, with the reference voltage $V_{BG}$. The third regulator 150 outputs the single enable signal PASS_SINGLE_PMCKEN according to a result of the comparison. If, as a result of the comparison, the division voltage DVc is higher than the reference voltage $V_{BG}$, the third regulator 150 generates the single enable signal PASS_SINGLE_PMCKEN of a low level. If, as a result of the comparison, the division voltage DVc is lower than the reference voltage $V_{BG}$, the third regulator 150 generates the single enable signal PASS_SINGLE_PMCKEN of a high level. Although a ripple phenomenon occurs in the pump output voltage VPUMPOUT when the single regulation operation is performed, the single enable signal PASS_SINGLE_PMCKEN is faster outputted because a response speed becomes fast by the capacitor CAP. Accordingly, the ripple of the pump output voltage VPUMPOUT generated from the pump circuit 120 is rapidly removed.

The control signal generator 160 generates the enable signal PMEN in response to the double enable signal PASS_DOUBLE_PMCKEN and the single enable signal PASS_SINGLE_PMCKEN of a high level. When the division voltage DVc is higher than the reference voltage $V_{BG}$, the control signal generator 160 generates the enable signal PMEN of a low level in response to the single enable signal PASS_SINGLE_PMCKEN of a low level. In response thereto, the oscillator 110 stops outputting the clock CLK and the inverted clock/CLK. As a result, the pump output voltage VPUMPOUT generated from the pump circuit 120 is prevented from rising.

When the division voltage DVc is lower than the reference voltage $V_{BG}$, the control signal generator 160 generates the enable signal PMEN of a high level in response to the single enable signal PASS_SINGLE_PMCKEN of a high level. In response thereto, the oscillator 110 continues to output the clock CLK and the inverted clock/CLK. The pump output voltage VPUMPOUT generated from the pump circuit 120 continues to rise until the division voltage DVc becomes higher than the reference voltage $V_{BG}$.

The fourth regulator 170 converts the pump output voltage VPUMPOUT, regulated by the third regulator 150 and the control signal generator 160, into voltage of a constant level. The fourth regulator 170 outputs the first regulation voltage VREG1 having a constant level.

In the above-described single regulation operation, current consumption is reduced because the current paths Current1 and Current2 are cut off. An area is reduced because the third regulator 150 shares the voltage divider 141 of the second regulator 140. Furthermore, the fourth regulator 170 generates the first regulation voltage VREG1 using the pump output voltage VPUMPOUT regulated by the third regulator 150 and the control signal generator 160. Accordingly, a ripple is prevented from occurring in the first regulation voltage VREG1.

2) A Double Regulation Operation

The oscillator 110 generates the clock CLK having a constant cycle and the inverted clock/CLK. The pump circuit 120 generates the pump output voltage VPUMPOUT in response to the clock CLK and the inverted clock/CLK.

When a double regulation operation is performed, the first regulator 130 is activated in response to the pass regulator enable signal PASS_REGEN. The first regulator 130 compares the division voltage $D_{VA}$, divided from the pump output voltage VPUMPOUT according to a ratio of the divided resistance values of the resistor R11 and the resistor R12, with the first reference voltage $V_{BG1}$. The first regulator 130 outputs the double enable signal PASS_DOUBLE_PMCKEN according to a result of the comparison.

If, as a result of the comparison, the division voltage $D_{VA}$ is higher than the first reference voltage $V_{BG1}$, the first regulator 130 generates the pass regulator enable signal PASS_REGEN of a low level. In response thereto, the control signal generator 160 generates the enable signal PMEN of a low level. Accordingly, the oscillator 110 stops its oscillation operation, and the pump circuit 120 stops its pumping operation. As a result, the pump output voltage VPUMPOUT is stabilized without rising.

If, as a result of the comparison, the division voltage $D_{VA}$ is lower than the first reference voltage $V_{BG1}$, the first regulator 130 generates the pass regulator enable signal PASS_REGEN of a high level. Since the node NG is in a floating state in response to the single regulator signal Single, the comparator CP13 of the third regulator 150 generates the single enable signal PASS_SINGLEE_PMCKEN of a high level. In response thereto, the control signal generator 160 generates the enable signal PMEN of a high level. Thus, the oscillator 110 continues to perform an oscillation operation, and the pump circuit 120 continues to perform a pumping operation. Accordingly, the pump output voltage VPUMPOUT rises.

The second regulator 140 and the fourth regulator 170 convert the pump output voltage VPUMPOUT into voltages of a constant level. The second regulator 140 and the fourth regulator 170 output the second regulation voltage VREG2 and the first regulation voltage VREG1 having respective constant levels. Here, the levels of the second regulation voltage VREG2 and the first regulation voltage VREG1 may be controlled by controlling the levels of the second and the third reference voltages $V_{BG2}$ and $V_{BG3}$.

As described above, in accordance with this disclosure, since the voltage generator capable of performing both the single regulation operation and the double regulation operation is used, an area occupied by the voltage generator in a nonvolatile memory device is reduced, and current consumption is reduced because the number of current paths is reduced in the single regulation operation. Furthermore, in the single regulation operation, the pump output voltage is regulated, and a ripple occurring in the pump output voltage is removed by a rapid response speed. Accordingly, a stable regulation voltage can be outputted.

What is claimed is:

1. A voltage generator of a nonvolatile memory device, comprising:
    an oscillator configured to generate clocks;
    a pump circuit configured to generate a pump output voltage in response to the clocks;
    a first regulator configured to compare a first division voltage, divided from the pump output voltage, with a first reference voltage in response to a pass regulator enable signal and generate a double enable signal for controlling the oscillator according to a result of the comparison;
    a second regulator comprising a comparator for comparing a second division voltage with a second reference voltage in response to a double regulator signal and generating a control signal according to a result of the comparison, a control circuit for supplying the pump output voltage to an output terminal in response to the control signal, and a voltage divider for generating the second division voltage by dividing voltage of the output terminal; and
    a third regulator configured to compare the second division voltage and a third reference voltage in response to a single regulator signal and generate a single enable signal for controlling the oscillator according to a result of the comparison,
    wherein the first regulator and the second regulator are activated when a double regulation operation is performed and the third regulator is activated when a single regulation operation is performed.

2. The voltage generator of claim 1, wherein:
    the first regulator controls the oscillator in response to the pass regulator enable signal so that the pump output voltage having a constant level is outputted,
    the second regulator performs control in response to the double regulator signal so that the first regulation voltage having a constant level is outputted to the output terminal, and
    the third regulator controls the oscillator in response to the single regulator signal so that the pump output voltage having a constant level is outputted.

3. The voltage generator of claim 2, wherein:
    when a single regulation operation, the operation of the oscillator is controlled by the third regulator, and
    when a double regulation operation, the operation of the oscillator is controlled by the first regulator and the first regulation voltage is controlled by the second regulator.

4. The voltage generator of claim 2, further comprising a fourth regulator configured to output the pump output voltage as a second regulation voltage having a constant level.

5. A voltage generator of a nonvolatile memory device, comprising:
    a pump circuit configured to generate a pump output voltage by performing a pumping operation and raise or maintain the output voltage in response to a double enable signal or a single enable signal;
    a first regulator configured to compare a first division voltage, divided from the pump output voltage, with a first reference voltage to generate the double enable signal according to a result of the comparison;
    a second regulator configured to compare a second division voltage, divided from the pump output voltage, with a second reference voltage, convert the pump output voltage into voltage of a first level according to a result of the comparison, and output the voltage of the first level as a first regulation voltage; and
    a third regulator configured to compare the second division voltage with the second reference voltage and generate the single enable signal according to a result of the comparison,
    wherein the first regulator is activated when a double regulation operation is performed.

6. The voltage generator of claim 5, wherein the third regulator is activated when a single regulation operation is performed.

7. The voltage generator of claim 5, wherein the pump circuit comprises:
a control signal generator for generating an enable signal in response to the double enable signal and the single enable signal;
an oscillator for generating clocks having a constant cycle in response to the enable signal; and
a pump unit for generating the pump output voltage by performing the pumping operation in response to the clocks.

8. The voltage generator of claim 5, further comprising a fourth regulator configured to convert the pump output voltage into voltage of a second level and output the voltage of the second level as a second regulation voltage.

9. The voltage generator of claim 5, wherein the second regulator comprises:
a voltage divider for generating the first regulation voltage and the second division voltage by dividing the pump output voltage; and
a comparison circuit for comparing the second division voltage with the second reference voltage and controlling an amount of current supplied to the voltage divider according to a result of the comparison.

10. The voltage generator of claim 9, wherein the third regulator comprises:
a first transfer unit for transferring the second division voltage generated from the voltage divider when a single regulation operation is performed;
a second transfer unit for transferring a capacitor voltage charged by the pump output voltage when the single regulation operation is performed and coupling a capacitor between the pump output voltage and a ground when a double regulation operation is performed; and
a comparison circuit for comparing the second division voltage or the capacitor voltage with a third reference voltage when the single regulation operation is performed and generating the single enable signal according to a result of the comparison.

11. A voltage generator of a nonvolatile memory device, comprising:
a pump circuit configured to generate a pump output voltage;
a first regulator configured to compare a first division voltage, divided from the pump output voltage, with a first reference voltage and generate a double enable signal according to a result of the comparison;
a second regulator configured to convert the pump output voltage into voltage of a constant level and output the voltage of the constant level as a regulation voltage;
a third regulator configured to compare a second division voltage, divided from the pump output voltage, with a second reference voltage and generate a single enable signal according to a result of the comparison; and
a control signal generator configured to generate an enable signal for controlling the pump circuit in response to the double enable signal and the single enable signal,
wherein the first regulator is activated when a double regulation operation is performed.

12. The voltage generator of claim 11, wherein the third regulator is activated when a single regulation operation is performed.

13. The voltage generator of claim 11, wherein the pump circuit comprises:
an oscillator for generating clocks having a constant cycle in response to the enable signal; and
a pump unit for generating the pump output voltage by performing a pumping operation in response to the clocks.

14. The voltage generator of claim 11, further comprising a fourth regulator configured to convert the pump output voltage into voltage of a second level and output the voltage of the second level as a second regulation voltage.

15. The voltage generator of claim 11, wherein the second regulator comprises:
a voltage divider for generating the second regulation voltage by dividing the pump output voltage; and
a comparison circuit for comparing the second division voltage and the second reference voltage and controlling an amount of current supplied to the voltage divider according to a result of the comparison.

16. The voltage generator of claim 15, wherein the third regulator comprises:
a first transfer unit for transferring the second division voltage generated from the voltage divider when a single regulation operation is performed;
a second transfer unit for transferring a capacitor voltage charged by the pump output voltage when the single regulation operation is performed and coupling a capacitor between the pump output voltage and a ground when a double regulation operation is performed; and
a comparison circuit for comparing the second division voltage or the capacitor voltage with a third reference voltage when the single regulation operation is performed and generating the single enable signal according to a result of the comparison.

17. The voltage generator of claim 16, wherein the second transfer unit couples the capacitor between an output node of the pump circuit and the ground when the double regulation operation is performed so that the pump output voltage is stabilized.

18. A voltage generator of a nonvolatile memory device, comprising:
a pump circuit configured to generate a pump output voltage by performing a pumping operation and raise or maintain the output voltage in response to a double enable signal or a single enable signal;
a first regulator configured to compare a first division voltage, divided from the pump output voltage, with a first reference voltage when a double regulation operation is performed and generate the double enable signal according to a result of the comparison;
a second regulator configured to convert the pump output voltage into voltage of a first level and generate the voltage of the first level as a first regulation voltage; and
a third regulator configured to compare a second division voltage, divided from the pump output voltage, with a second reference voltage when a single regulation operation is performed, generate the single enable signal according to a result of the comparison, and coupling a capacitor between the pump output voltage and a ground when the double regulation operation is performed so that the pump output voltage is stabilized,
wherein the first regulator and the second regulator are activated when the double regulation operation is performed and the third regulator is activated when the single regulation operation is performed.

19. The voltage generator of claim 18, wherein the pump circuit comprises:
a control signal generator for generating an enable signal in response to the double enable signal and the single enable signal;

an oscillator for generating clocks having a constant cycle in response to the enable signal; and a pump unit for generating the pump output voltage by performing the pumping operation in response to the clocks.

20. The voltage generator of claim 18, further comprising a fourth regulator configured to convert the pump output voltage into voltage of a second level and output the voltage of the second level as a second regulation voltage.

21. The voltage generator of claim 18, wherein the second regulator comprises:

a voltage divider for generating the first regulation voltage and the second division voltage by dividing the pump output voltage; and a comparison circuit for comparing the second division voltage with the second reference voltage and controlling an amount of current supplied to the voltage divider according to a result of the comparison.

22. The voltage generator of claim 21, wherein the third regulator comprises:

a first transfer unit for transferring the second division voltage generated from the voltage divider when the single regulation operation is performed;

a second transfer unit for transferring a capacitor voltage charged by the pump output voltage when the single regulation operation is performed and coupling the capacitor between the pump output voltage and the ground when the double regulation operation is performed; and a comparison circuit for comparing the second division voltage or the capacitor voltage with a third reference voltage when the single regulation operation is performed and generating the single enable signal according to a result of the comparison.

* * * * *